(12) United States Patent
Dommer et al.

(10) Patent No.: US 7,439,677 B2
(45) Date of Patent: Oct. 21, 2008

(54) MICROWAVE GENERATOR

(75) Inventors: Josef Dommer, Nürnberg (DE); Geoffrey Staines, Röthenbach (DE)

(73) Assignee: Diehl BGT Defence GmbH & Co., KG, Überlingen (DE)

( * ) Notice: Subject to any disclaimer, the term of this patent is extended or adjusted under 35 U.S.C. 154(b) by 221 days.

(21) Appl. No.: 11/522,147

(22) Filed: Sep. 15, 2006

(65) Prior Publication Data

US 2007/0068934 A1 Mar. 29, 2007

(30) Foreign Application Priority Data

Sep. 16, 2005 (DE) .................. 10 2005 044 353

(51) Int. Cl.
*H01T 2/00* (2006.01)

(52) U.S. Cl. ..................... 315/39; 315/39.69

(58) Field of Classification Search ............... 315/39, 315/39.51, 39.53, 39.63, 39.69, 4, 5; 307/106, 307/107
See application file for complete search history.

(56) References Cited

U.S. PATENT DOCUMENTS

| 4,104,558 | A |   | 8/1978 | Proud, Jr. et al. |
| 4,751,429 | A | * | 6/1988 | Minich .............................. 315/5 |
| 4,942,337 | A | * | 7/1990 | Beerwald et al. .............. 315/39 |
| 6,822,394 | B2 |  | 11/2004 | Staines et al. |
| 6,969,944 | B2 |  | 11/2005 | Staines et al. |
| 7,002,300 | B2 |  | 2/2006 | Urban et al. |

FOREIGN PATENT DOCUMENTS

| DE | 221 894 A1 | 9/1983 |
| DE | 101 51 565 A1 | 10/2001 |

* cited by examiner

*Primary Examiner*—David Hung Vu
(74) *Attorney, Agent, or Firm*—Scully, Scott, Murphy & Presser, P.C.

(57) ABSTRACT

A microwave generator having a central electrode (14) which at the front end has a radiating element (22) and an external electrode (18) which coaxially surrounds the central electrode (14) along an axially extending resonator portion (16), wherein the two electrodes (14 and 18) are of a rotationally symmetrical configuration and define a spark gap (62) which sparks across when a high voltage is applied and radiates microwaves by way of the resonator portion (16) and the radiating element (22) of the central electrode (14). The spark gap (62) is in the form of an annular spark gap, which is determined by a connection element (26) which projects at the rear end axially centrally away from the central electrode (14) and an annular edge (44) of the external electrode (18), the edge being provided coaxially with respect to the connection element (26). The central electrode (14) and the external electrode (18) are arranged in a housing sleeve (12) of an electrically insulating material. The housing sleeve (12) preferably has an extension (58) defining a space (56) in which there is arranged a high voltage source (30), which is electrically conductively connected to the electrodes (14 and 18) of the microwave generator (10)

11 Claims, 1 Drawing Sheet

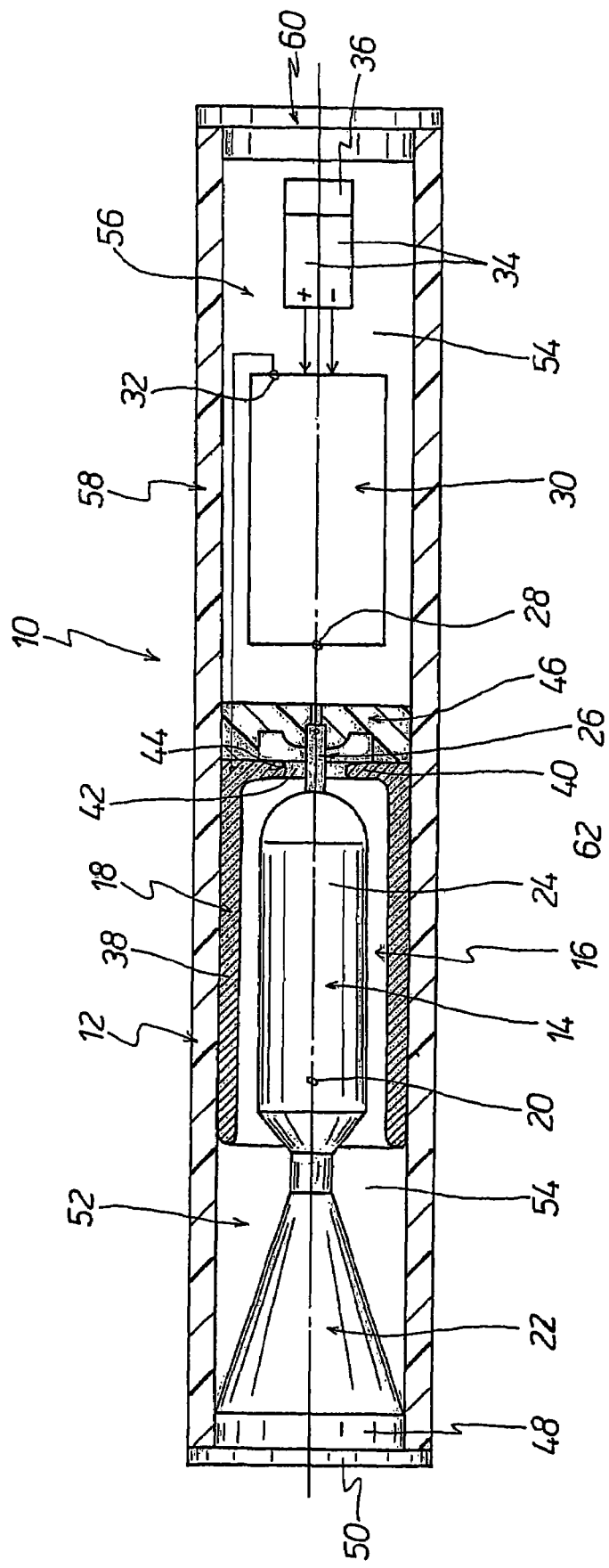

MICROWAVE GENERATOR

BACKGROUND OF THE INVENTION

1. Field of the Invention

The invention concerns a microwave generator comprising two coaxially arranged electrodes which are provided in a housing and which are separated by way of a spark gap, which sparks across when a high voltage is applied for the radiation of microwaves.

The functioning of such a microwave generator is based on a high voltage source being short-circuited across a spark gap and thus discharged. The high voltage source can have a capacitor array which is charged up in parallel on the basis of the principle of the Marx surge voltage circuit and which is then connected in series. As an alternative to using a Marx surge voltage circuit it is also possible to employ an explosive-operated high voltage generator, which, in comparison with conventional high voltage generators, can provide a single high voltage pulse with an extremely high level of pulse energy.

As a consequence of the short-circuiting of the high voltage source across the spark gap, strongly oscillating discharge or short-circuit currents with a steep edge occur, which involve a mix of very high frequencies which are radiated by way of a radiation element forming an antenna as microwave energy with a wide-band spectrum which is dependent on the frequency mix. That wide-band microwave spectrum has a very high level of energy density so that, in the area surrounding such a microwave generator, for example radio communication is at least adversely affected or input circuits of electronic circuit arrangements can be interfered with by virtue of resonance effects or in the extreme case can even be destroyed.

2. Discussion of the Prior Art

German Patent Application No. DE 101 51 565 A1 discloses a microwave generator which has a high voltage spark gap between axially alignedly arranged electrodes, wherein on both sides of the spark gap the electrodes and their coaxial holders are accompanied at least over a part of their axial longitudinal extent by an electrical conductor which extends in spaced relationship therewith and which is electrically conductingly connected to one of the electrodes. In that microwave generator the spark gap is formed between a small mushroom top-shaped electrode and a larger lobe-like electrode. The lobe-like electrode is surrounded by an outer conductor connected to the mushroom top-shaped electrode by way of a suitable connecting structure. That connecting structure, together with the mushroom top-shaped electrode, can be displaced by way of a spindle mechanism in respect of its axial position in relation to the stationary second electrode and the stationary conductor surrounding same, for tuning purposes.

Prior filed German Patent Application No 10 2005 002 279 discloses a microwave generator having a central electrode which at the front end has a radiating element and an external electrode which coaxially surrounds the central electrode along an axially extending resonator portion, wherein the two electrodes are of a rotationally symmetrical configuration and define a spark gap which sparks across when a high voltage is applied and radiates microwaves by way of the radiating element of the central electrode. That microwave generator substantially comprises the two metallic electrodes, namely the central electrode with the radiating element and the external electrode coaxially enclosing same, the electrodes defining the axially extending resonator portion of the microwave generator. The metallic electrodes are mounted to the mutually remote ends of an electrically insulating housing sleeve and can be charged up by simply contacting at the two axially mutually remote ends of the electrodes with a pulsed high voltage source. This involves what is referred to as a twin-wire feed. The interior of the housing sleeve, apart from the two electrodes, does not contain any further parts and components, which could adversely affect high voltage dielectric strength. To increase high voltage dielectric strength the internal space of the microwave generator can be filled with a gaseous or liquid dielectric. The gaseous dielectric is for example $SF_6$.

In the microwave generator of the last-mentioned kind the high voltage source which is preferably formed by a Marx generator is arranged laterally beside the microwave generator and in parallel relationship therewith so that the voltage outputs of the high voltage source, which are at the mutually remote ends of the Marx generator, can be connected to the axially mutually remote ends of the microwave generator. That ensures optimum dielectric strength. The maximum holding voltage of the microwave generator is determined by the external spacing of the two metallic elements.

In that known microwave generator the spark gap is oriented on its longitudinal axis, that is to say it is oriented axially.

SUMMARY OF THE INVENTION

The object of the invention is to provide a microwave generator of the kind set forth in the introductory portion of this specification, which, instead of a laterally parallel arrangement, permits an axially linear arrangement of the microwave generator with an associated high voltage source, without a reduction in dielectric strength.

The microwave generator according to the invention has the advantage that the high voltage source can be arranged in axially aligned successive relationship with the microwave generator so that it is possible to implement a structure which is cylindrical in a bar shape, and the resonator spark gap is integrated into the axially aligned feed.

BRIEF DESCRIPTION OF THE DRAWING

Further details, features and advantages will be apparent from the description hereinafter of an embodiment by way of example of the microwave generator according to the invention, which is diagrammatically shown in the single FIGURE of drawing in a longitudinal sectional view.

DETAILED DESCRIPTION OF THE INVENTION

The FIGURE shows a configuration of the microwave generator 10, which in a housing sleeve 12 has a central electrode 14 and an external electrode 18, which coaxially encloses the central electrode 14 along an axially extending resonator portion 16. The central electrode 14 and the external electrode 18 are of a rotationally symmetrical configuration around a central longitudinal axis 20.

A radiating element 22 adjoins the central electrode 14 at the front end, in one piece in respect of the material thereof, with the radiating element 22 being enlarged in a tapering configuration forwardly away from the central electrode 14.

The central electrode 14 has a lobe portion 24 which defines the resonator portion 16 and from which the radiating element 22 projects at the front end. At the rear end a connection element 26 extends away from the lobe portion 24, that is to say it extends in the direction of the central longitudinal axis 20. The connection element 26 serves for connection contacting with an output terminal 28 of a high voltage source 30. The high voltage source 30 has a second output connection 32, which is electrically conductively connected to the external electrode 18. The high voltage source 30 is connected together with two small DC/DC high voltage transformers 34. A battery for the two high voltage transformers 34 is denoted by reference 36.

The high voltage transformer 34 is provided for producing a moderate voltage of for example ±10 kV. The high voltage source 30 is suitable for producing a high voltage of for example 300 kV.

The external electrode 18 is of a pot-like configuration with a cylindrical wall 38 and a rear end portion 40 having a through hole 42. The through hole 42 is defined by an annular edge 44. The connection element 26 of the central electrode 14 extends through the through hole 42.

The connection element 26 of the central electrode 14 is held fast in centered relationship by a holding element 46. The holding element 46 comprises electrically insulating material.

The connection element 26 with the holding element 46 therefore serves for accurately positioned fixing of the central electrode 14 at its rearward end. The radiating element 22 is formed at its front end with a sealing edge 48 against which the housing sleeve 12 bears closely and sealingly with its front end. The radiating element 22 is closed at its front end by an end element 50.

The housing sleeve 12, the sealing edge 48 of the radiating element 42 and the holding element 46 with the connection element 26 define and sealingly delimit an electrode interior 52 filled with a gaseous or liquid dielectric 54.

The housing sleeve 12 is prolonged rearwardly by way of the holding element 46. The high voltage source 30 with the high voltage transformers 34 and the battery 36 are arranged in the space 56 which is defined by a rearward extension 58 of the housing sleeve 12, the holding element 46 and a rearward sealing closure element 60. That space 56 is preferably filled with the same gaseous or liquid dielectric 54 as the electrode interior 52. In that case the holding element 46 does not need to be fixed sealingly in the housing sleeve 12 but only needs to be provided for accurately centered positioning of the connection element 46.

The microwave generator 10 according to the invention therefore advantageously has a coaxial feed for the pulsed high voltage of the high voltage source 30, while an unwanted reduction in dielectric strength is avoided in a simple fashion.

While in known microwave generators the spark gap between the electrodes 14 and 18 extends in the axial direction, the microwave generator 10 according to the invention provides that the spark gap 62 is provided in a radial direction in an annular configuration between the central connection element 26 and the annular edge 44 of the central through hole 43 in the end portion 40 of the external electrode 18.

LIST OF REFERENCES 10 microwave generator
12 housing sleeve (of 12)
14 central electrode (of 10 in 12)
16 resonator portion (of 10)
18 external electrode (of 10 in 12)
20 central longitudinal axis (of 10)
22 radiating element (of 10 on 14)
24 lobe portion (of 14)
26 connection element (on 24 for 62)
28 output connection (of 30 for 26)
30 high voltage source (for 10)
32 second output connection (of 30 for 18)
34 high voltage transformer (for 30)
36 battery (for 34)
38 cylindrical wall (of 18)
40 end portion (of 18)
42 central through hole (in 40)
44 annular edge (of 42)
46 holding element (for 26 in 12)
48 sealing edge (of 22)
50 end element (of 22)
52 electrode internal space (of 10)
54 dielectric (in 52 and 56)
space (for 30, 34 and 36)
extension (of 12 for 56)
closure element (for 56)
spark gap (between 26 and 44)

What is claimed is:

1. A microwave generator including a central electrode (14) having a radiating element (22) at a front end, and an external electrode (18) which coaxially surrounds the central electrode (14) along an axially extending resonator portion (16), the two electrodes (14 and 18) possessing a rotationally symmetrical configuration and defining a spark gap (62) which sparks across upon the application of a high voltage and radiates microwaves through the radiating element (22) of the central electrode (14), the spark gap (62) being in the form of an annular spark gap which is determined by a connection element (26) which projects at a rear end axially centrally away from the central electrode (14) and an annular edge (44) of the external electrode (18), said edge being located coaxially with respect to the connection element (26).

2. A microwave generator according to claim 1, wherein the central electrode (14) has a lobe portion (24) which determines the resonator portion (16) and from which the radiating element (22) projects at the front end and the connection element (26) projects at the rear end.

3. A microwave generator according to claim 1, wherein the external electrode (18) is of a pot-like configuration having a cylindrical wall (38) and an end portion (40), the end portion (40) including a central through hole (42), the annular edge (44) of which defining the spark gap and through which there extends the connection element (26) of the central electrode (14).

4. A microwave generator according to one of claims 1, wherein the central electrode (14) and the external electrode (18) are arranged in a housing sleeve (12) of an electrically insulating material, and wherein the radiating element (22) is sealed relative to the housing sleeve (12) by a front-end sealing edge portion (48).

5. A microwave generator according to claim 4, wherein the connection element (26) of the central electrode (14) is held in centered relationship by a holding element (46) of an electrically insulating material which is arranged in the housing sleeve (12).

6. A microwave generator according to claim 5, wherein the holding element (46) is arranged in a sealing relationship at the rearward end of the housing sleeve (12).

7. A microwave generator according to claim 6, wherein an electrode interior (52) which is defined by the housing sleeve (12), the sealing edge portion (48) of the radiating element (22) and the holding element (46) is selectively filled with a gaseous or a liquid dielectric.

8. A microwave generator according to claim 4, wherein the housing sleeve (12) is axially extended beyond the holding element (46), and a high voltage source (30) is provided in a space (56) which is defined by the extension (58) of the housing sleeve (12) and which is sealingly closed at the rear end thereof.

9. A microwave generator according to claim 8, wherein the space (56) in which the high voltage source (30) is provided is selectively filled with a gaseous or liquid dielectric (54).

10. A microwave generator according to claim 9, wherein the electrode interior (52) and the space (56) in which the high voltage source (30) is arranged are both filled with the same gaseous or liquid dielectric (54).

11. A microwave generator according to claim 8, wherein provided in the space (56) defined by the housing sleeve extension (58) is an energy supply (34, 36) for the high voltage source (30).

* * * * *